United States Patent [19]
Kunishi

[11] Patent Number: 6,010,357
[45] Date of Patent: Jan. 4, 2000

[54] SYSTEM FOR CONNECTING FLAT FLEXIBLE CIRCUITRY

[75] Inventor: Shinsuke Kunishi, Yamato, Japan

[73] Assignee: Molex Incorporated, Lisle, Ill.

[21] Appl. No.: 09/144,422

[22] Filed: Aug. 31, 1998

[30] Foreign Application Priority Data

Sep. 5, 1997 [JP] Japan ................................. 9-257473

[51] Int. Cl.<sup>7</sup> ........................................... H01R 13/56
[52] U.S. Cl. ........................................ 439/495; 439/77
[58] Field of Search ........................... 439/67, 77, 493, 439/495, 496

[56] References Cited

U.S. PATENT DOCUMENTS

| | | | |
|---|---|---|---|
| 4,024,627 | 5/1977 | Stauffer | 29/588 |
| 4,674,815 | 6/1987 | Chambers et al. | 439/592 |
| 4,824,391 | 4/1989 | Ii | 439/77 |
| 4,990,724 | 2/1991 | Suppelsa et al. | 174/261 |
| 5,141,455 | 8/1992 | Ponn | 439/620 |
| 5,297,968 | 3/1994 | Johnson et al. | 439/67 |
| 5,316,486 | 5/1994 | Tanaka et al. | 439/496 |
| 5,529,502 | 6/1996 | Peltier | 439/493 |
| 5,616,050 | 4/1997 | Suski | 439/495 |
| 5,675,888 | 10/1997 | Owen et al. | 439/77 |

*Primary Examiner*—Michael L. Gellner
*Assistant Examiner*—Briggitte R. Hammond
*Attorney, Agent, or Firm*—Stephen Z. Weiss

[57] ABSTRACT

An electrical device is provided for facilitating the connection of the conductors of a flat flexible circuit to the conductors of a complementary mating connecting device. A flat flexible circuit includes a flap integral therewith and bent out of the flat plane thereof. A relatively inflexible backing structure is fixed in a supporting position behind the flap for providing relatively rigid support for the flap when mated with the complementary mating connecting device.

15 Claims, 4 Drawing Sheets

SYSTEM FOR CONNECTING FLAT FLEXIBLE CIRCUITRY

FIELD OF THE INVENTION

This invention generally relates to the art of electrical connectors and, particularly, to an electrical device for facilitating connecting a flat flexible circuit to a complementary mating connecting device.

BACKGROUND OF THE INVENTION

A flat flexible circuit conventionally includes an elongated flat flexible dielectric substrate having conductors, such as laterally spaced conductor strips, on one or both sides thereof. The conductors may be covered with a thin,, flexible protective layer on one or both sides of the circuit. If protective layers are used, cutouts are formed therein to expose the underlying conductors at desired contact locations where the conductors are to engage the conductors of a complementary mating connecting device which may be a second flat flexible circuit, a printed circuit board or the terminals or contacts of a mating connector.

A wide variety of connectors have been designed over the years for terminating or interconnecting flat flexible circuits with complementary mating connecting devices. For instance, the flat circuit may be terminated to a plug connector or a receptacle connector, and that connector is connectable with a complementary mating receptacle or plug connector. One of the problems with employing mating connectors is the ever-increasing manufacturing costs of such connecting devices which require two complete connectors at each connecting interface. Another problem involves the ever-increasing miniaturization of electronic circuitry and the space limitations within which mating connectors must be accommodated. Still another problem involves the ever-increasing density of the conductors on a flat flexible circuit and the increasing number of terminals in the connector. It is difficult to maintain sufficiently high contact pressure between the terminals of a pair of connectors and the respective conductors of a pair of circuits. The present invention is directed to solving this myriad of problems in terminating flat flexible circuitry.

SUMMARY OF THE INVENTION

An object, therefore, of the invention is to provide a new and improved electrical device for facilitating the connection of the conductors of a flat flexible circuit to the conductors of a complementary mating connecting device.

In the exemplary embodiment of the invention, a flat flexible circuit is provided with a tongue integral therewith and bent out of the flat plane thereof. A relatively inflexible backing structure is fixed in a supporting position behind the tongue for providing relatively rigid support for the tongue when mated with the complementary mating connecting device, such as a connector with discrete terminals. With this invention, one of the mating connectors of a complementary mating pair of connectors is completely eliminated.

As disclosed herein, the flat flexible circuit is formed with an I-shaped slot defining a pair of the tongues bent out of the plane of the circuit. The backing structure is located between the tongues in its supporting position. The backing structure includes a generally planar wall generally coplanar with the flat circuit when in the supporting position. The backing structure is fixed in that position by an adhesive tape applied to the flat circuit and the coplanar wall of the backing structure. A pair of side walls project from the planar wall of the backing structure in supporting position behind the pair of tongues.

The invention also is directed to a method of fabricating the aforesaid electrical device by providing a flat flexible circuit and forming the slot therein. The backing structure is inserted through the slot into its supporting position behind the tongue(s), and the adhesive tape is applied to hold the backing structure in its supporting position.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
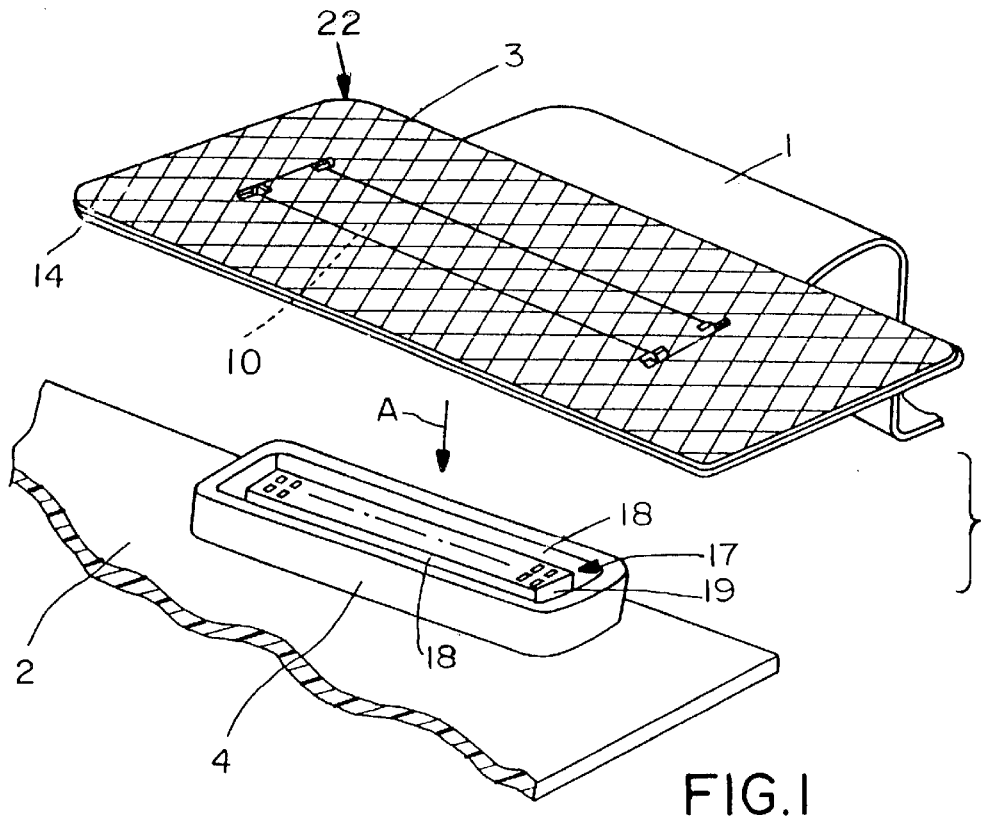
FIG. 1 is a perspective view of the electrical device according to the invention, in conjunction with a complementary mating connector.

Referring to the drawings in greater detail, and first to FIG. 1, the invention is incorporated in an electrical device, generally designated 22, for facilitating the connection of the conductors of a flat flexible circuit 1 to the conductors of a complementary mating connecting device. Very generally, flat flexible circuit 1 is interconnected to a printed circuit board 2. Specifically, a connecting end portion 3 of the flat flexible circuit is connected to a complementary mating receptacle connector 4 mounted on printed circuit board 2. The flat flexible circuit is connected to the receptacle connector in the direction of arrow "A".

Flat flexible circuit 1 (3) is fairly conventional, in that it includes a flat flexible dielectric substrate. Conductors are provided on at least a conductor side 5 of the substrate.

Figures 2A, 2B, 2C, 2D:
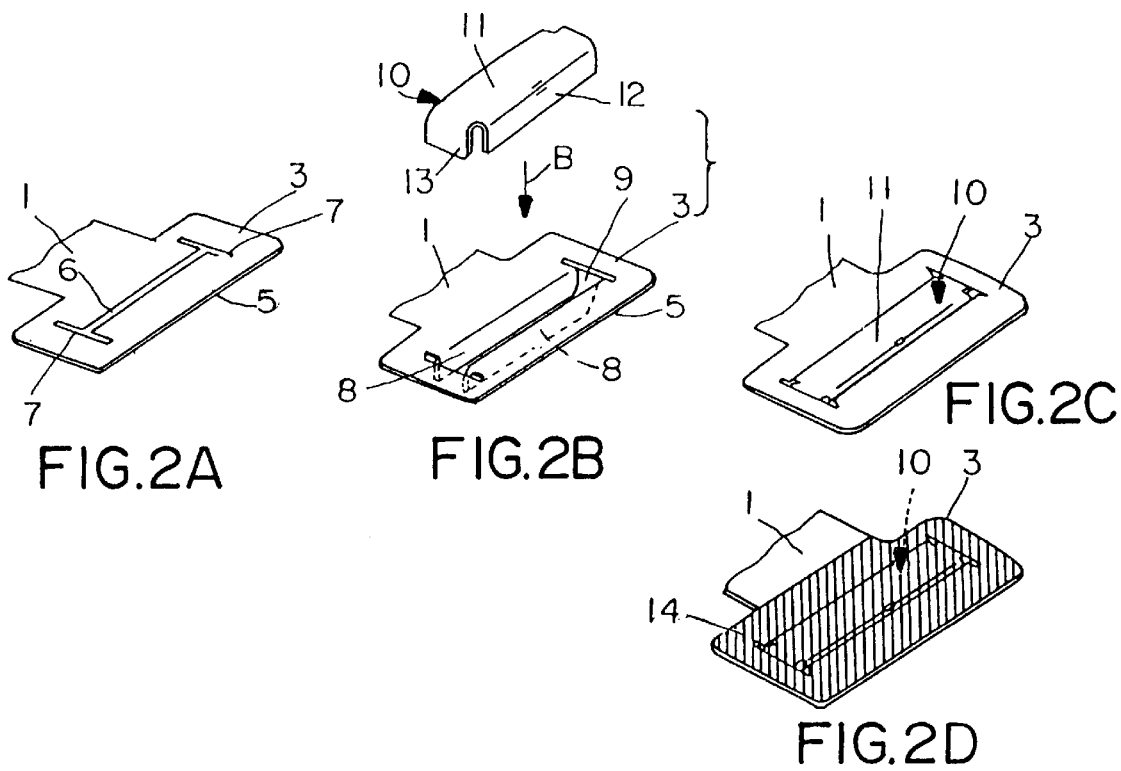
FIGS. 2A–2D are sequential views in the fabrication and assembly of the electrical device.

The fabrication and assembly of electrical device 22 are shown in the sequential views of FIGS. 2A–2D. Referring first to FIG. 2A, an I-shaped slot in formed in the circuit by an elongated slit 6 and cross slits 7 at opposite ends of the elongated slit. Referring to FIG. 2B, a pair of elongated flaps or tongues 8 are bent out of the plane of the flat flexible circuit to define an opening 9. The flaps remain integral with the circuit, with the conductors on conductor side 5 of the circuit being disposed on the outsides of the flaps and facing away from opening 9.

Figure 5:
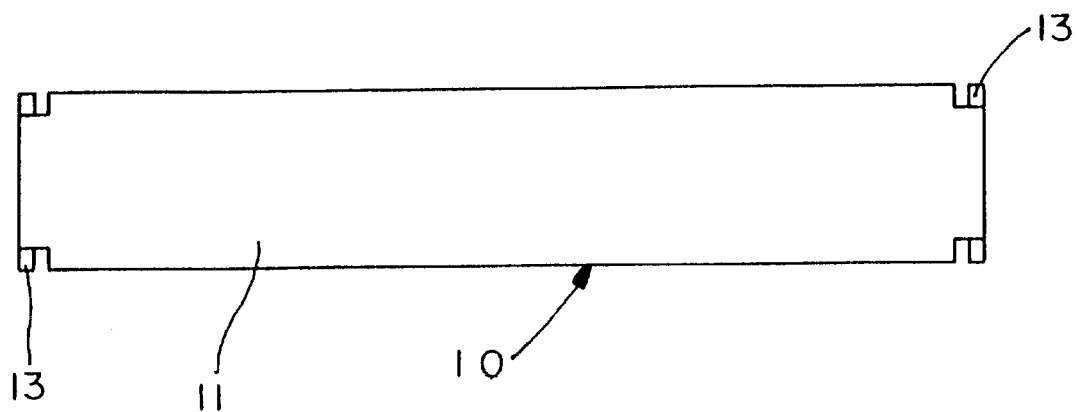
FIG. 5 is a top plan view of the backing structure.
Figure 6:
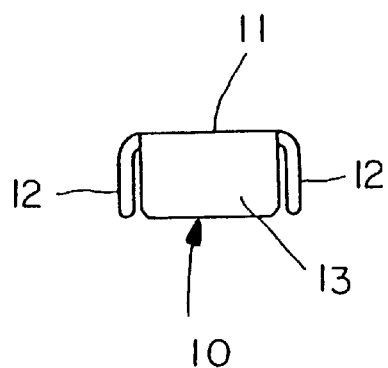
FIG. 6 is an end elevational view of the backing structure.

Referring to FIG. 2B in conjunction with FIGS. 5 and 6, a backing structure, generally designated 10, includes a planar wall 11, a pair of elongated side walls 12 and a pair of end walls 13. The backing structure is inserted into opening 9 in the flat flexible circuit in the direction of arrow "B" (FIG. 2B) between bent flaps 8. The backing structure is inserted into the opening until planar wall 11 is coplanar with the flat flexible circuit as shown in FIG. 2C.

Figure 3:
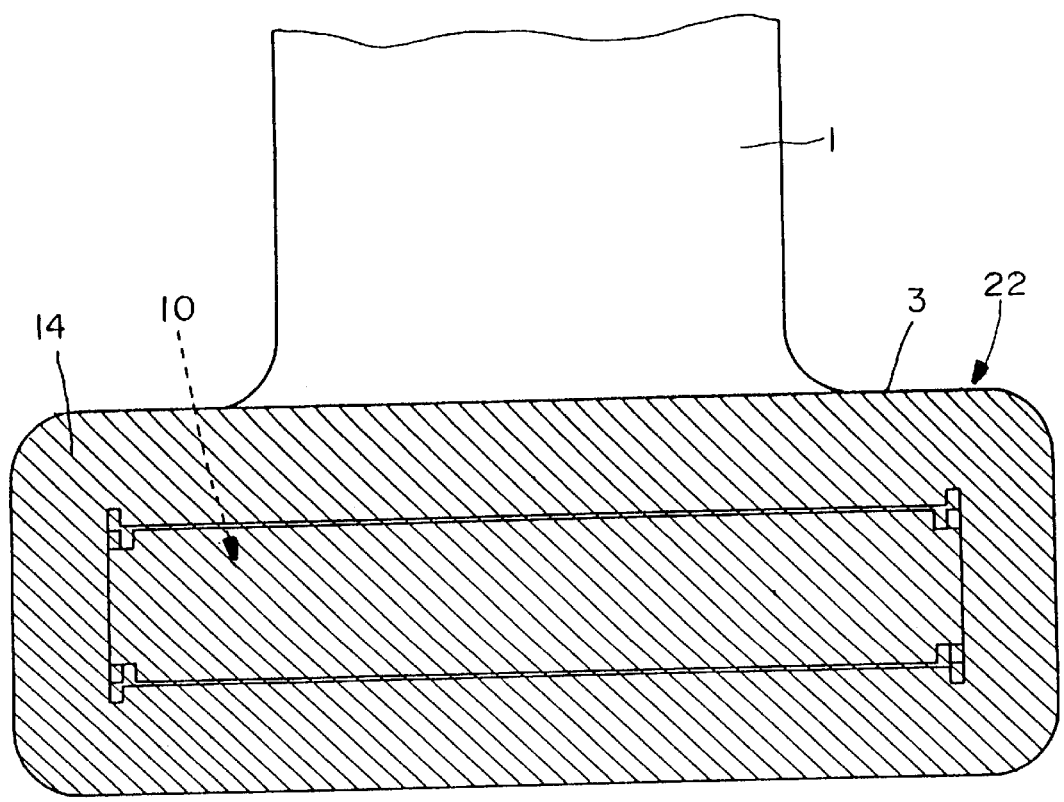
FIG. 3 is a top plan view, on an enlarged scale, of the electrical device.
Figure 4:
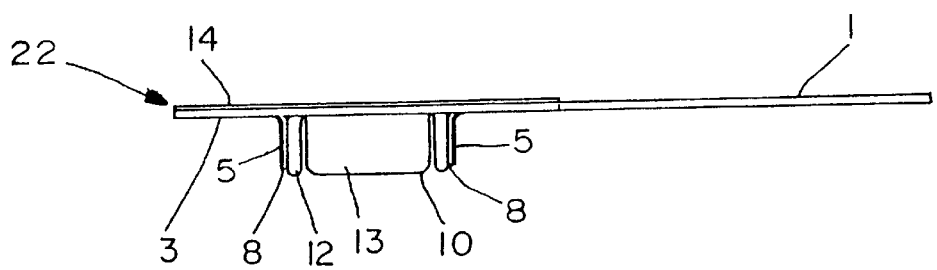
FIG. 4 is a side elevational view of the electrical device.

FIG. 2D, in conjunction with FIGS. 3 and 4, shows the final fabricating or assembly step of applying a strip of adhesive tape 14 onto the flat circuit and coplanar wall 11 of backing structure 10. The adhesive tape fixes the backing structure in a supporting position behind and supporting flaps 8 as best seen in FIG. 4. It can be seen that the conductors on conductor sides 5 of the flaps face outwardly away from the inner supporting backing structure.

Figure 7:
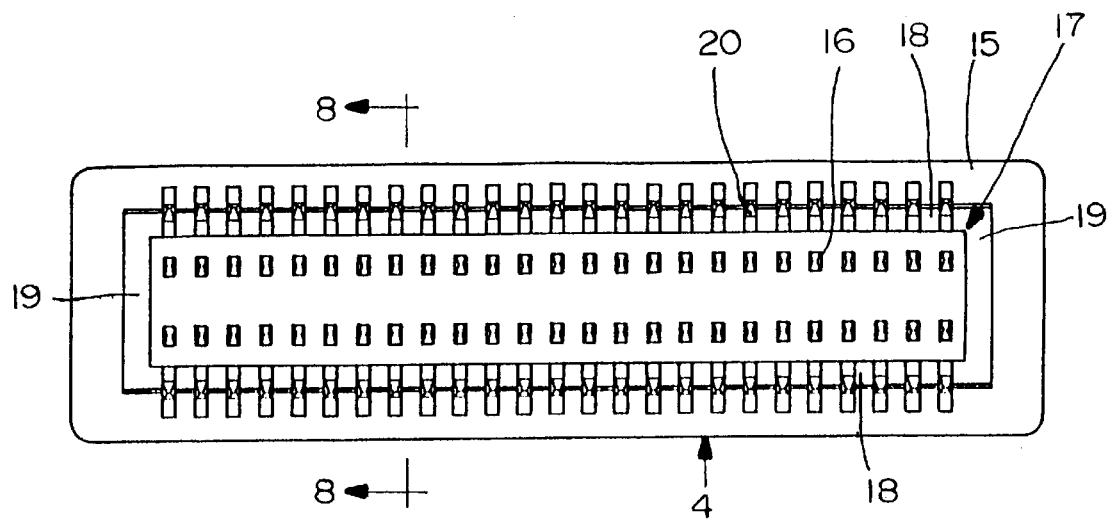
FIG. 7 is a top plan view of the complementary mating connector.

Referring to FIG. 7 in conjunction with FIG. 1, receptacle connector 4 which is mounted on printed circuit board 2, includes a dielectric or insulative housing 15 mounting a plurality of terminals 16. A rectangular groove, generally designated 17, includes elongated side groove portions 18 and end cross groove portions 19. This rectangular groove configuration is sized and shaped for receiving the rectangular configuration defined by side walls 12 and end walls 13 of backing structure 10, along with the bent flaps 8 of the flexible circuit.

Figure 8:
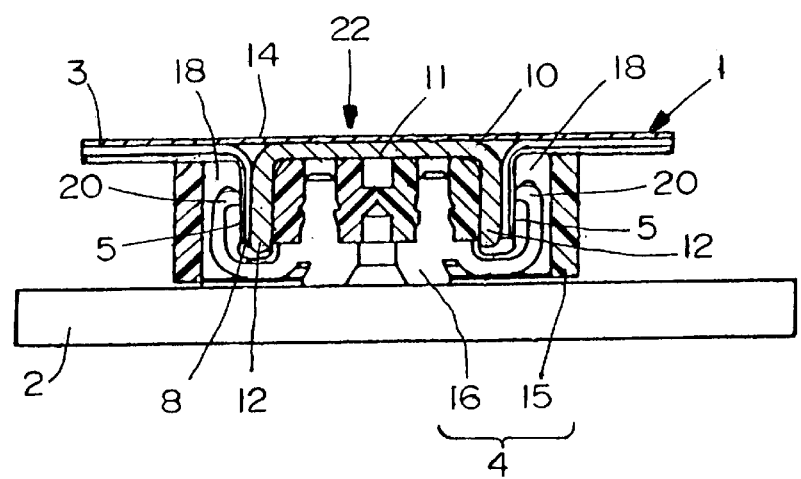
FIG. 8 is a section taken generally along line 8—8 of FIG. 7.

FIG. 8 shows electrical device 22 for flat flexible circuit 1 fully mated with receptacle connector 4 on printed circuit board 2. It can be seen that resilient contact portions 20 of terminals 16 project inwardly into elongated slot portions 18 for engaging the conductors on conductor sides 5 of flaps 8 of the flexible circuit. Side walls 12 of backing structure 10 provide rigid support behind flaps 8 to maintain pressure between the conductors on the flaps and resilient contact portions 20 of the terminals.

From the foregoing, it can be understood that a complete connector has been eliminated in a typical male and female or plug and receptacle connector assembly by simply using the interior backing structure to support the conductors on the flat flexible circuit against the conductors or terminals of the receptacle connector. In other words, a separate connector, including terminals etc., is not terminated to flat flexible circuit 1 in order to connect the circuit to printed circuit board 2. It also should be understood that other fixing means than adhesive tape 14 can be employed. For instance, side walls 12 could be adhered directly to the inside of bent flaps 8. Still further, a single flap could be bent out of a slit in the flat flexible circuit and supported by a backing structure fixed to the circuit.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. An electrical device for facilitating the connection of the conductors of a flat flexible circuit to the conductors of a complementary mating connecting device, comprising:

a circuit including a flat flexible insulating substrate having conductors on at least one side thereof, and a slot in the substrate defining a flap integral therewith and bent out of the plane thereof with the conductors facing away from the slot;

a relatively inflexible backing structure inserted through the slot into a supporting position behind the flap with the conductors facing away therefrom, whereby the backing structure and the flap can be mated with the complementary mating connecting device; and means for fixing the backing structure in said supporting position.

2. The electrical device of claim 1 wherein said means for fixing the backing structure comprises an adhesive tape.

3. The electrical device of claim 1 wherein said slot is generally I-shaped to define a pair of said flaps bent out of the plane of the substrate, with the backing structure being located between the flaps in said supporting position.

4. The electrical device of claim 1 wherein said backing structure includes a generally planar wall generally coplanar with the flat substrate when in said supporting position.

5. The electrical device of claim 4 wherein said means for fixing the backing structure comprises an adhesive tape on the coplanar substrate and wall of the backing structure.

6. The electrical device of claim 4 wherein said slot is generally I-shaped to define a pair of said flaps bent out of the plane of the substrate, with the backing structure being located between the flaps in said supporting position, said backing structure including a pair of side walls projecting from said planar wall in supporting position behind said pair of flaps.

7. An electrical device for facilitating the connection of the conductors of a flat flexible circuit to the conductors of a complementary mating connecting device, comprising:

a circuit including a flat flexible insulating substrate having conductors on at least one side thereof, and a generally I-shaped slot in the substrate defining a pair of flaps integral therewith and bent out of the plane thereof with the conductors facing away from the slot;

a relatively inflexible backing structure inserted through the slot into a supporting position, the backing structure having a generally planar wall and a pair of projecting side walls, the planar wall being generally coplanar with the flat substrate when the backing structure is in its supporting position, and the side walls being juxtaposed behind the flaps with the conductors facing away therefrom, whereby the backing structure and the flaps can be mated with the complementary mating connecting device; and an adhesive tape on the coplanar substrate and planar wall of the backing structure for fixing the backing structure in its supporting position.

8. An electrical device for facilitating the connection of the conductors of a flat flexible circuit to the conductors of a complementary mating connecting device, comprising:

a flat flexible circuit having a tongue integral therewith and bent out of the flat plane thereof; and a relatively inflexible backing structure fixed in a supporting position behind the tongue for providing relatively rigid support for the tongue when mated with the complementary mating connection device.

9. The electrical device of claim 8 wherein said flat flexible circuit includes an I-shaped slot defining a pair of said tongues bent out of the plane of the circuit, with the backing structure being located between the tongues in said supporting position.

10. The electrical device of claim 8 wherein said backing structure includes a generally planar wall generally coplanar with the flat circuit when in said supporting position.

11. The electrical device of claim 10 wherein said means for fixing the backing structure comprises an adhesive tape on the coplanar circuit and wall of the backing structure.

12. The electrical device of claim 10 wherein said slot is generally I-shaped to define a pair of said tongues bent out of the plane of the substrate, with the backing structure being located between the tongues in said supporting position, said backing structure including a pair of side walls projecting from said planar wall in supporting position behind said pair of tongues.

13. A method of fabricating an electrical device for facilitating the connection of the conductors of a flat flexible circuit to the conductors of a complementary mating connecting device, comprising the steps of:

provoking a flat flexible circuit with conductors on at least one side thereof;

forming a slot in the circuit defining a flap integral therewith;

bending the flap out of the plane of the circuit with the conductors facing away from the slot;

inserting a relatively inflexible backing structure through the slot into a supporting position behind the flap with the conductors facing away therefrom; and fixing the backing structure in its supporting position.

14. The method of claim 13 wherein said fixing step comprises applying an adhesive tape to the backing structure and circuit.

15. The method of claim 13 wherein said slot is formed with a generally I-shape to define a pair of said flaps bent out of the plane of the circuit, and the backing structure is inserted between the flaps in its supporting position.

* * * * *